(12) United States Patent
Chiang et al.

(10) Patent No.: US 11,430,823 B2
(45) Date of Patent: Aug. 30, 2022

(54) METHOD FOR MANUFACTURING SEMICONDUCTOR IMAGE SENSOR DEVICE HAVING DEEP TRENCH ISOLATION

(71) Applicant: TAIWAN SEMICONDUCTOR MANUFACTURING COMPANY LTD., Hsinchu (TW)

(72) Inventors: Yen-Ting Chiang, Tainan (TW); Chun-Yuan Chen, Tainan (TW); Hsiao-Hui Tseng, Tainan (TW); Sheng-Chan Li, Tainan (TW); Yu-Jen Wang, Kaohsiung (TW); Wei Chuang Wu, Tainan (TW); Shyh-Fann Ting, Tainan (TW); Jen-Cheng Liu, Hsin-Chu (TW); Dun-Nian Yaung, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/069,665

(22) Filed: Oct. 13, 2020

(65) Prior Publication Data
US 2021/0043664 A1 Feb. 11, 2021

Related U.S. Application Data

(62) Division of application No. 15/937,210, filed on Mar. 27, 2018, now Pat. No. 10,825,853.

(Continued)

(51) Int. Cl.
*H01L 27/14* (2006.01)
*H01L 27/146* (2006.01)

(52) U.S. Cl.
CPC .... *H01L 27/1463* (2013.01); *H01L 27/14687* (2013.01); *H01L 27/14689* (2013.01); *H01L 27/1464* (2013.01); *H01L 27/14643* (2013.01)

(58) Field of Classification Search
CPC ........... H01L 27/1463; H01L 27/14689; H01L 27/14687; H01L 27/1464; H01L 27/14643
(Continued)

(56) References Cited

U.S. PATENT DOCUMENTS

| 10,748,955 B2 | 8/2020 | Oh et al. |
| 2015/0130016 A1* | 5/2015 | Kao .................. H01L 21/76224 257/510 |

(Continued)

FOREIGN PATENT DOCUMENTS

CN 106856201 A 6/2017

OTHER PUBLICATIONS

Office Action, Cited Reference and Search Report dated Apr. 13, 2021 issued by the China National Intellectual Property Administration for the Chinese counterpart application No. 201811229019.8.

(Continued)

*Primary Examiner* — Mohammad M Hoque
(74) *Attorney, Agent, or Firm* — WPAT, P.C. Intellectual Property Attorneys; Anthony King

(57) ABSTRACT

A semiconductor image sensor device includes a semiconductor substrate, a radiation-sensing region, and a first isolation structure. The radiation-sensing region is in the semiconductor substrate. The first isolation structure is in the semiconductor substrate and adjacent to the radiation-sensing region. The first isolation structure includes a bottom isolation portion in the semiconductor substrate, an upper (Continued)

isolation portion in the semiconductor substrate, and a diffusion barrier layer surrounding a sidewall of the upper isolation portion.

20 Claims, 14 Drawing Sheets

Related U.S. Application Data

(60) Provisional application No. 62/583,906, filed on Nov. 9, 2017.

(58) Field of Classification Search
USPC .......................................................... 257/447
See application file for complete search history.

(56) References Cited

U.S. PATENT DOCUMENTS

| | | |
|---|---|---|
| 2015/0372031 A1 | 12/2015 | Yoon et al. |
| 2015/0380447 A1* | 12/2015 | Chou ...................... H01L 33/20 257/437 |
| 2016/0204142 A1* | 7/2016 | Um ..................... H01L 27/1463 257/446 |
| 2017/0200757 A1* | 7/2017 | Ihara .................. H01L 27/1463 |
| 2017/0207270 A1* | 7/2017 | Chen ................ H01L 27/14689 |
| 2017/0365631 A1* | 12/2017 | Iizuka ............... H01L 27/14636 |

OTHER PUBLICATIONS

U.S. Appl. No. 10/748,955 B2 corresponds to CN106856201A.

* cited by examiner

METHOD FOR MANUFACTURING SEMICONDUCTOR IMAGE SENSOR DEVICE HAVING DEEP TRENCH ISOLATION

PRIORITY CLAIM AND CROSS-REFERENCE

This application is a divisional application of U.S. patent application Ser. No. 15/937,210 filed on Mar. 27, 2018, entitled of "SEMICONDUCTOR IMAGE SENSOR DEVICE WITH DEEP TRENCH ISOLATIONS AND METHOD FOR MANUFACTURING THE SAME", which claims priority of U.S. provisional application Ser. No. 62/583,906 filed on 9 Nov. 2017, which is incorporated by reference in its entirety.

BACKGROUND

Semiconductor image sensor devices such as complementary metal-oxide-semiconductor (CMOS) image sensor (CIS) and charge-coupled device (CCD) sensor are able to sense radiation such as light, and are widely used in various applications such as digital still camera (DSC) or mobile phone camera applications. The semiconductor image sensor device includes pixels arranged in an array on a substrate, and each pixel includes a photodiode and driving components for absorbing radiation projected toward the substrate and converting the sensed radiation into electrical signals.

The pixels of semiconductor image sensors are isolated from one another by isolation structures such as deep trench isolations (DTIs). The DTI of a conventional semiconductor image sensor is formed through a shallow trench isolation (STI) oxide layer, and thus the upper portion of the DTI has a tapered profile. As pixel pitch scales down, the DTI with tapered profile faces layout limitations, and thus reduces the layout area for pixels.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
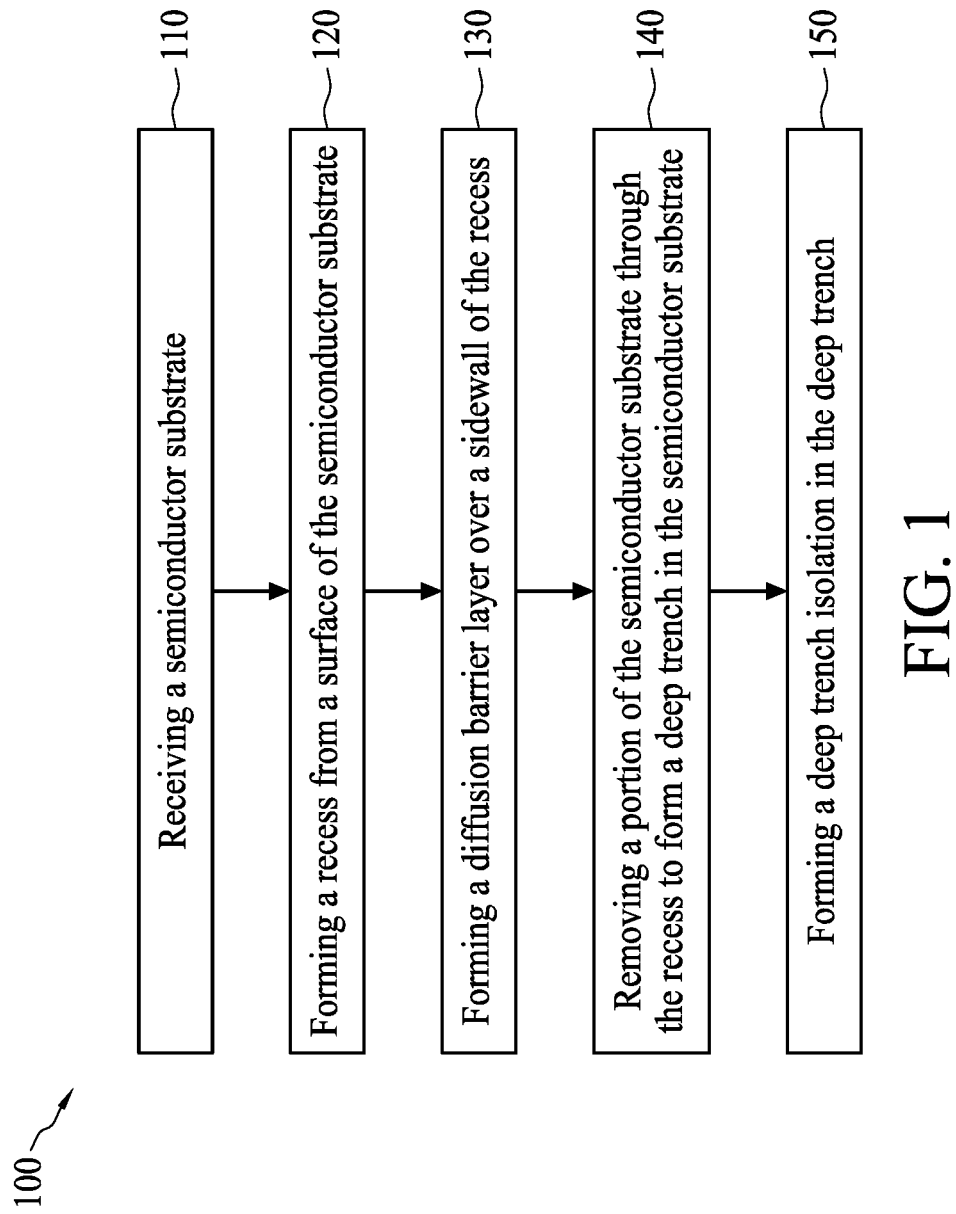
FIG. 1 is a flow chart illustrating a method for manufacturing a semiconductor image sensor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to +10°, such as less than or equal to +5°, less than or equal to +4°, less than or equal to ±3°, less than or equal to +2°, less than or equal to ±1°, less than or equal to ±0.5°, less than or equal to ±0.1°, or less than or equal to ±0.05°.

In one or more embodiments of the present disclosure, a semiconductor image sensor device includes a plurality of radiation-sensing regions, and a plurality of DTIs between adjacent radiation-sensing regions. The bottom isolation portion of the DTI is laterally surrounded by a doped layer. The doped layer may help to repair defects due to formation of the deep trench, and thus reduce dark current and crosstalk between adjacent radiation-sensing regions. The upper isolation portion of the DTI is laterally surrounded by a diffusion barrier layer. The diffusion barrier layer may help to mitigate diffusion of the dopants from the doped layer to the front side of the semiconductor substrate, and thus the driving components adjacent to the upper insolation portion of the DTI can be operated normally. The diffusion barrier layer is substantially conformal with respect to the sidewall of the deep trench, and thus the profile of the upper isolation portion of the DTI is relatively small. Accordingly, more layout areas can be provided for more radiation-sensing regions. The deep trench, the diffusion barrier layer and the doped layer may be formed in a self-aligned manner, thus the alignment of the deep trench, the diffusion barrier layer and the doped layer may not be an issue to consider, and the manufacturing costs may be reduced.

FIG. 1 is a flow chart illustrating a method for manufacturing a semiconductor image sensor device according to various aspects of one or more embodiments of the present disclosure. The method 100 begins with operation 110 in which a semiconductor substrate is received. The method 100 proceeds with operation 120 in which a recess is formed from a surface of the semiconductor substrate. The method 100 continues with operation 130 in which a diffusion barrier layer is formed over a sidewall of the recess. The method 100 proceeds with operation 140 in which a portion of the semiconductor substrate is removed through the recess to form a deep trench in the semiconductor substrate. The method 100 continues with operation 150 in which a deep trench isolation is formed in the deep trench.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
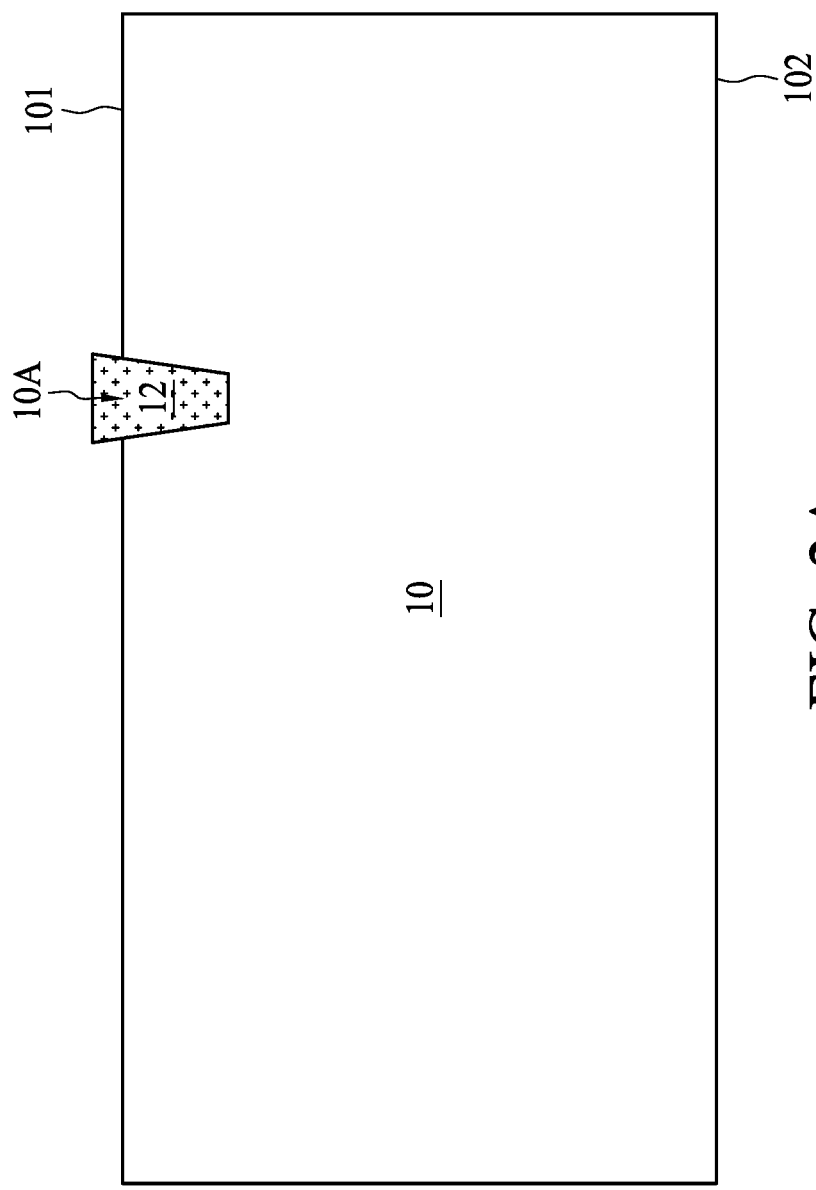
FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L and FIG. 2M are schematic views at one of various operations of manufacturing a semiconductor image sensor device according to one or more embodiments of the present disclosure.
Figure 2B:
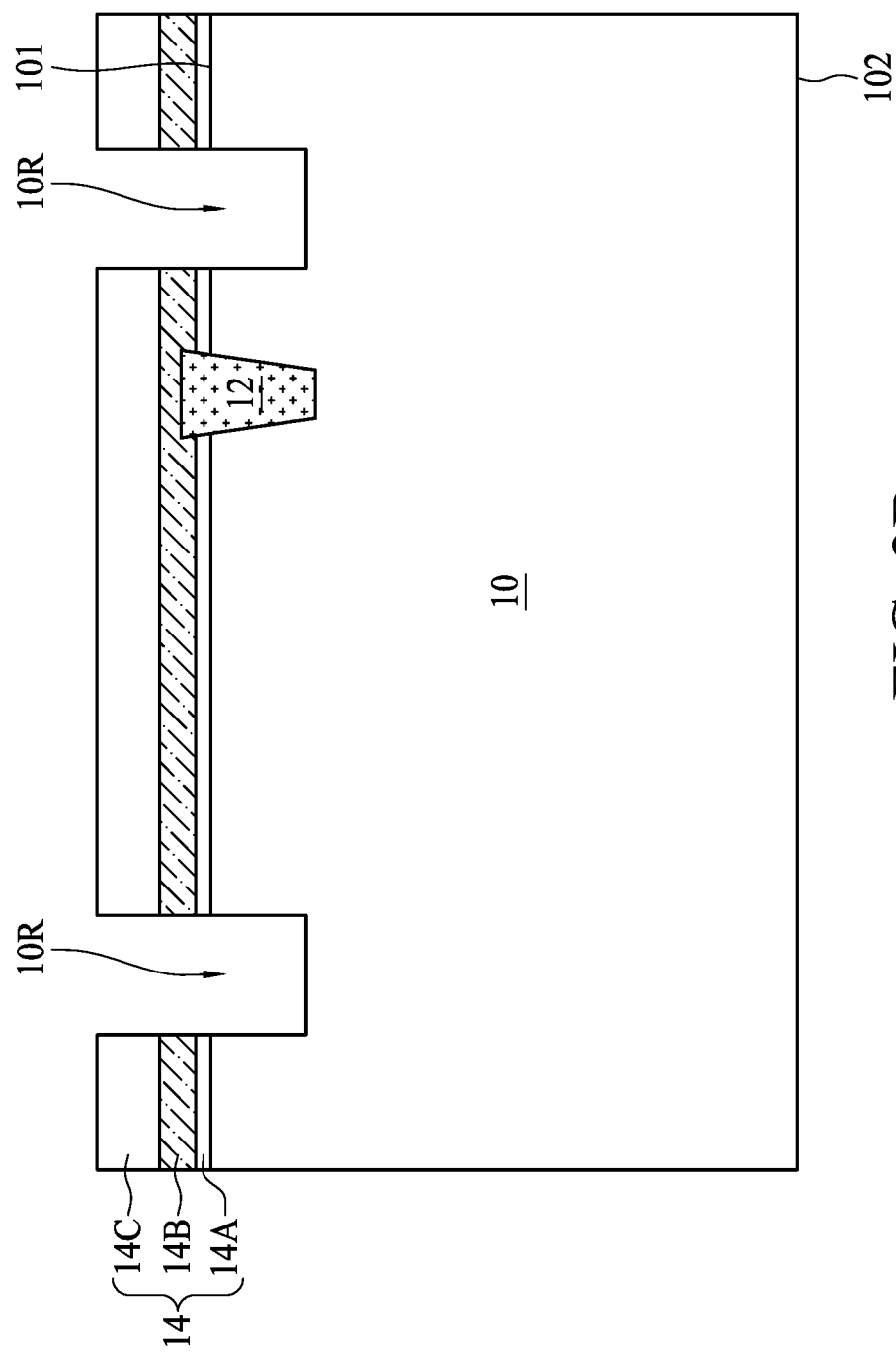
Figure 2C:
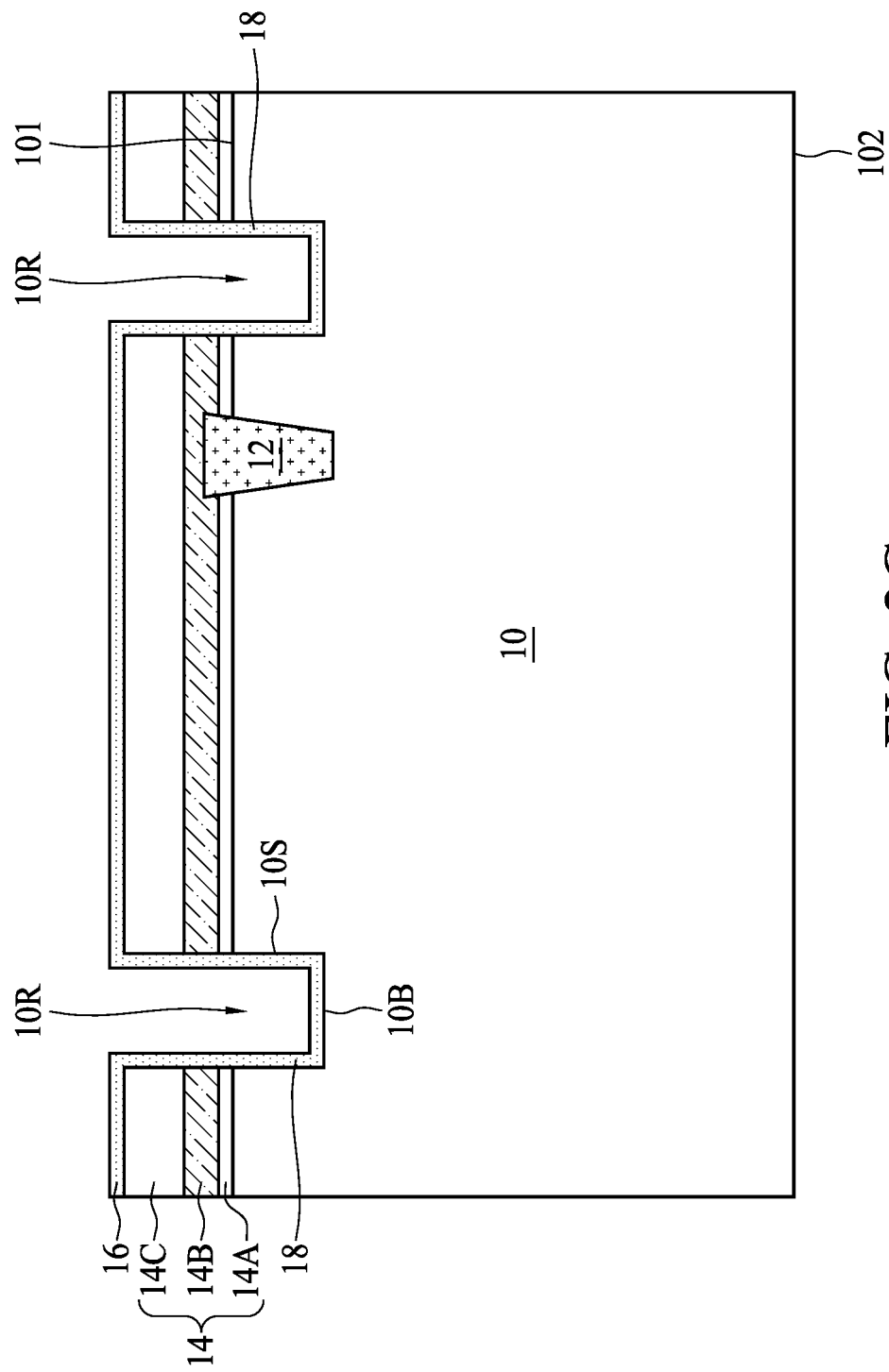
Figure 2D:
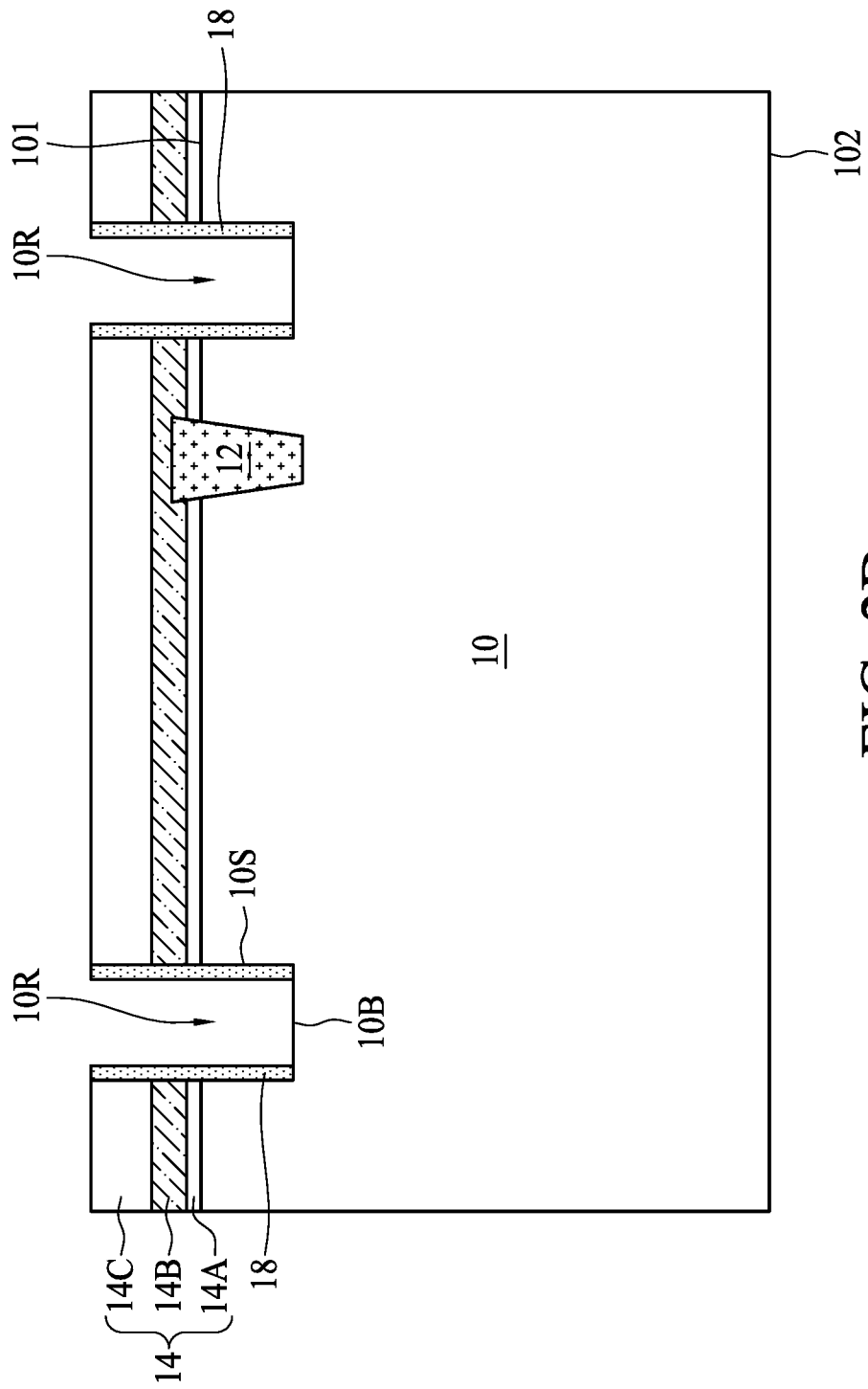
Figure 2E:
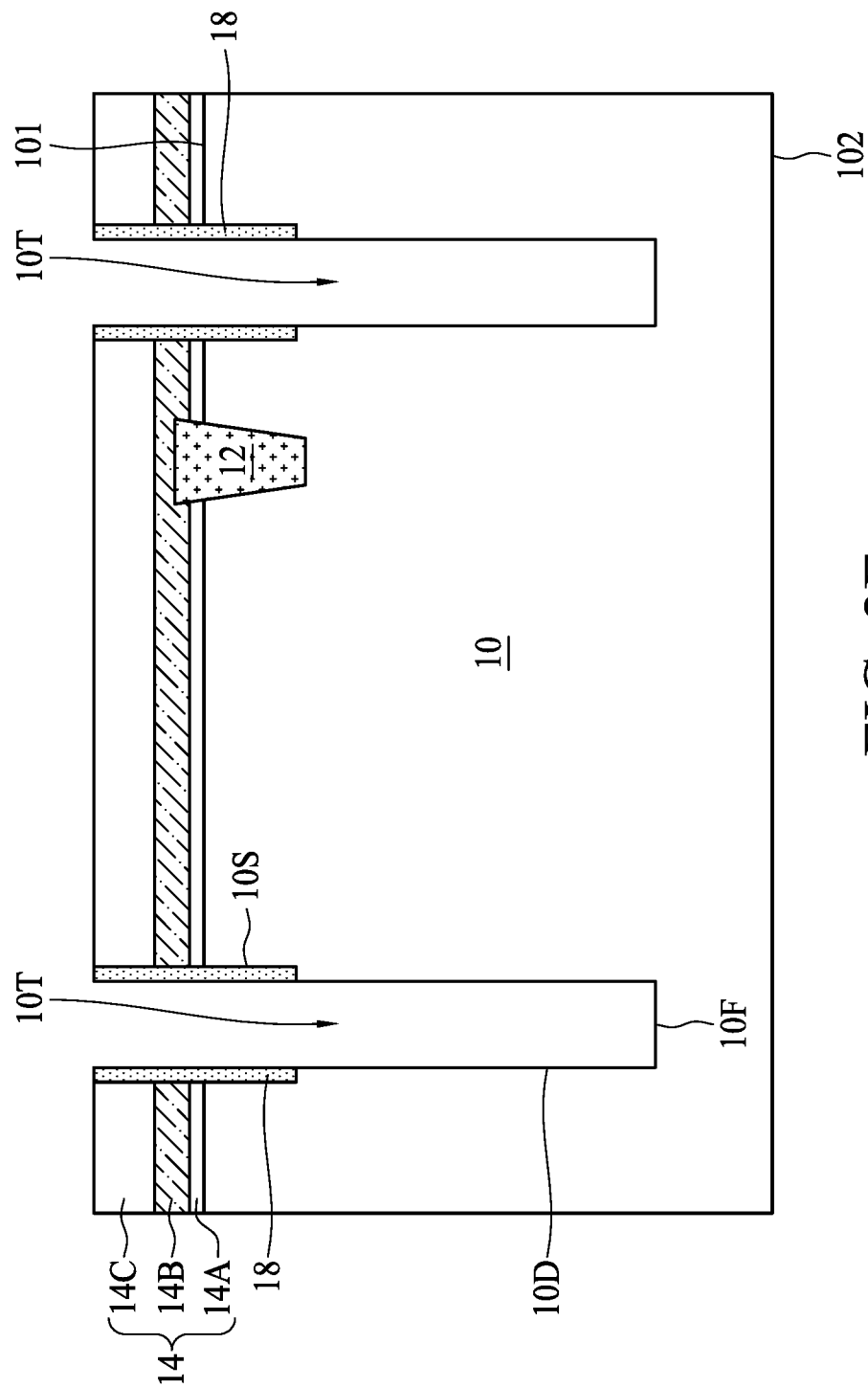
Figure 2F:
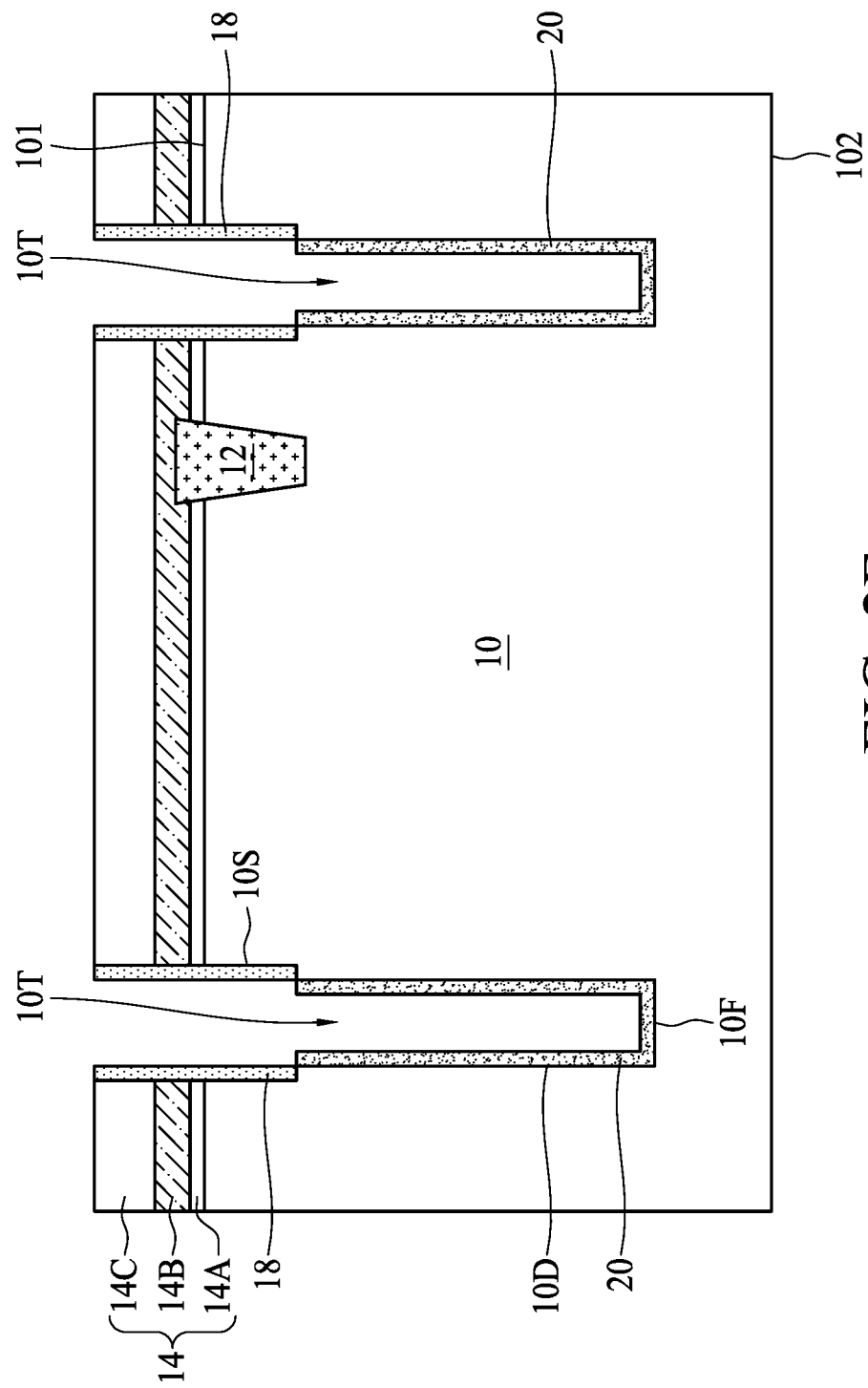
Figure 2G:
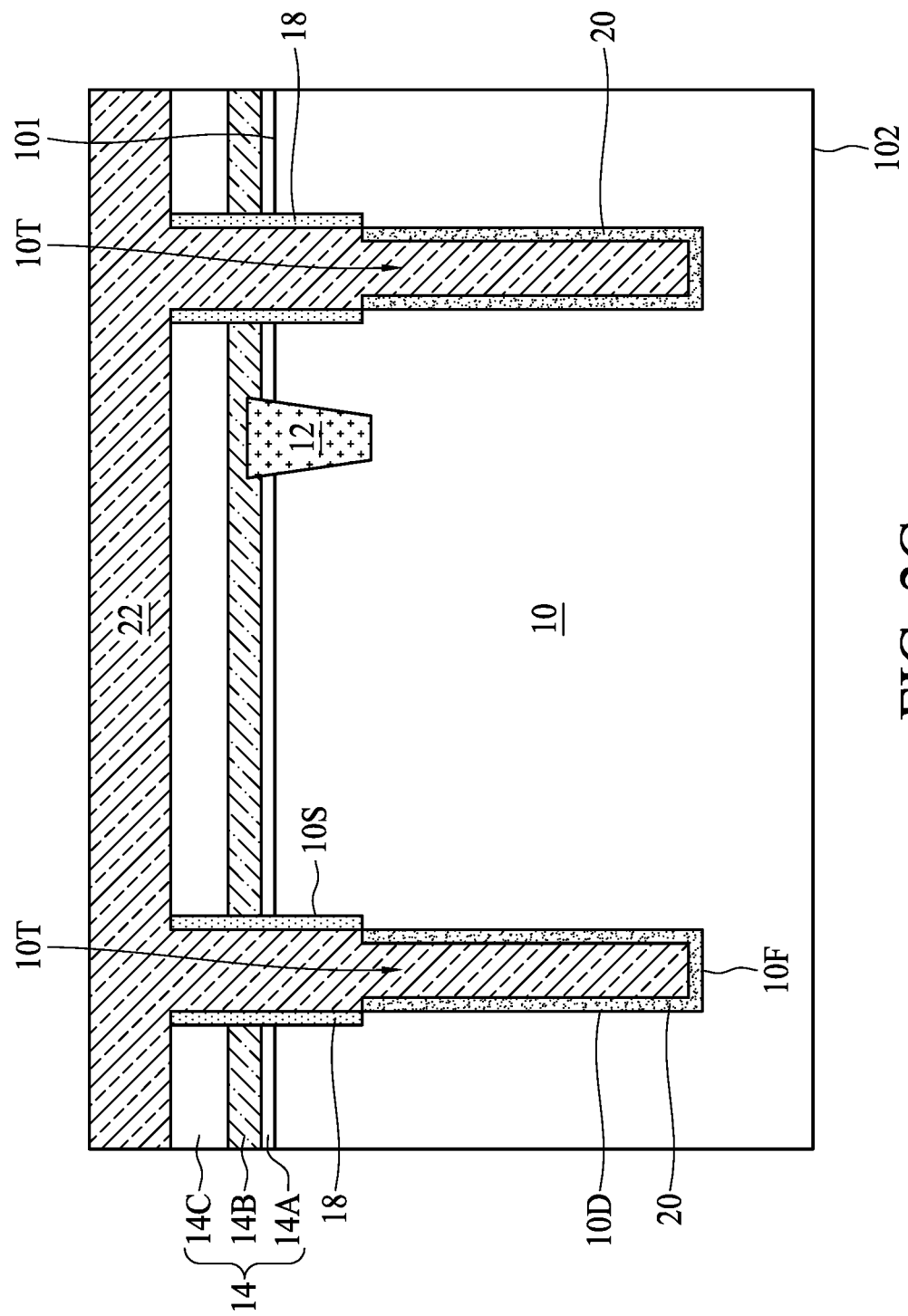
Figure 2H:
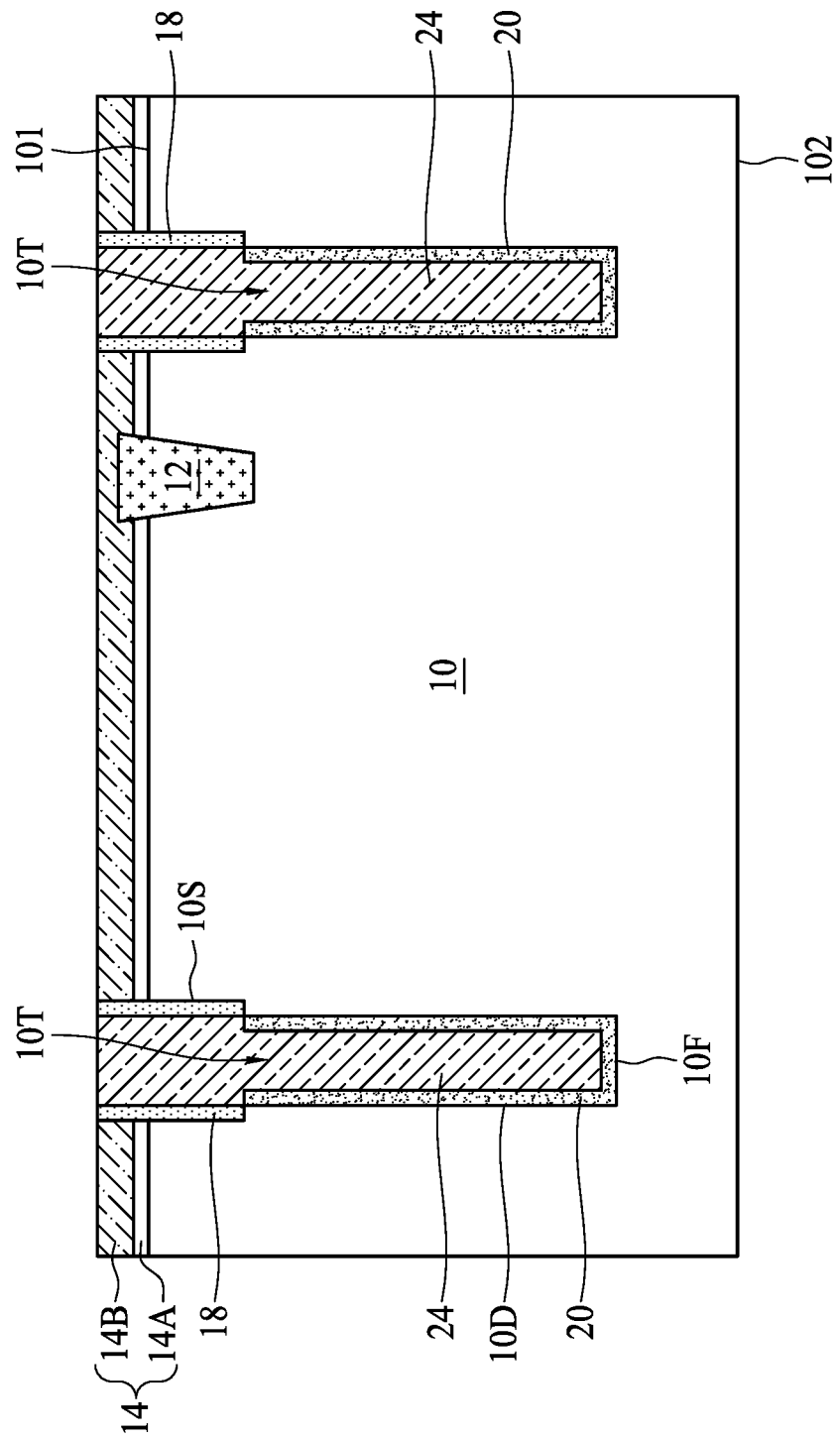
Figure 2I:
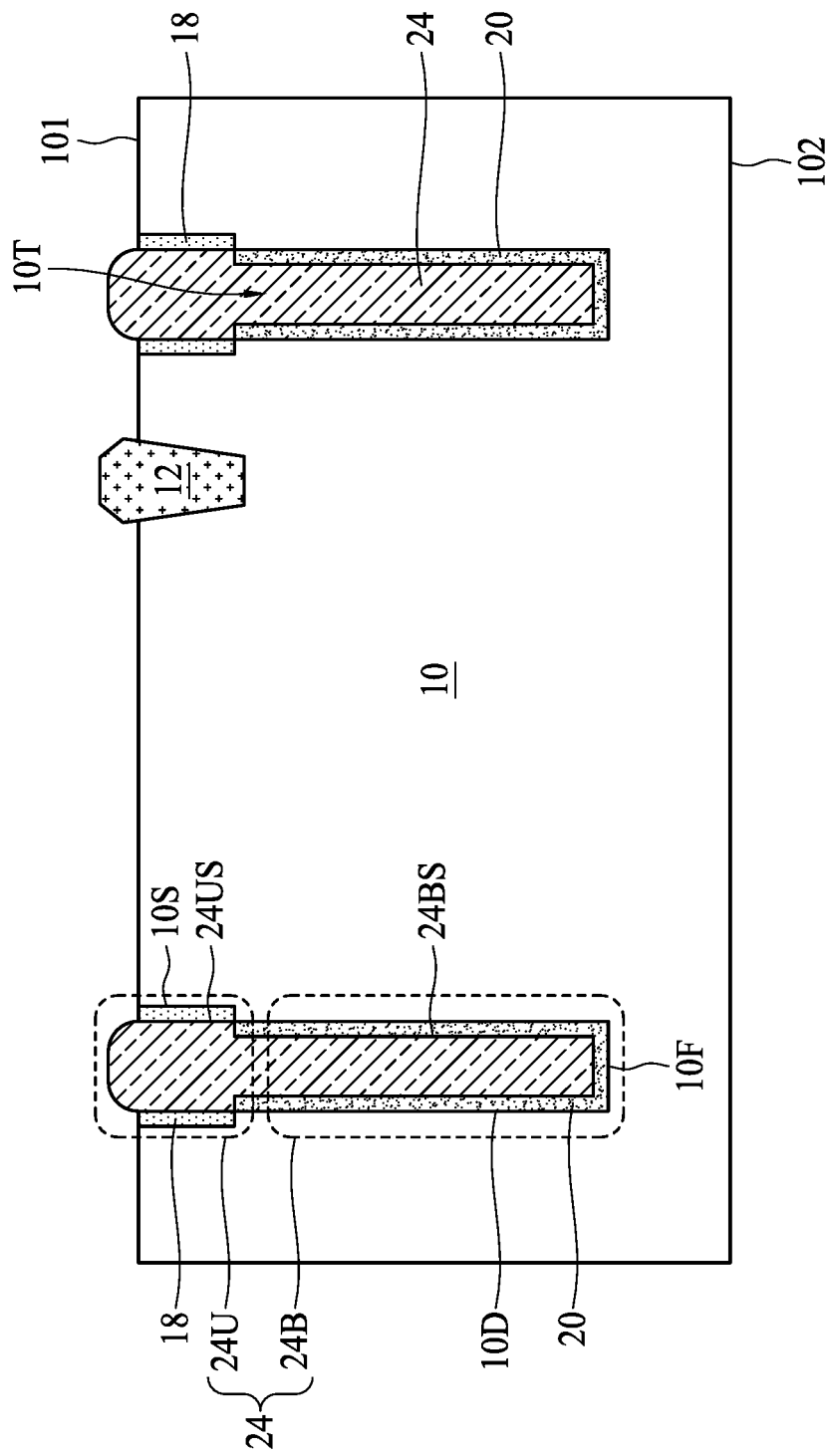
Figure 2J:
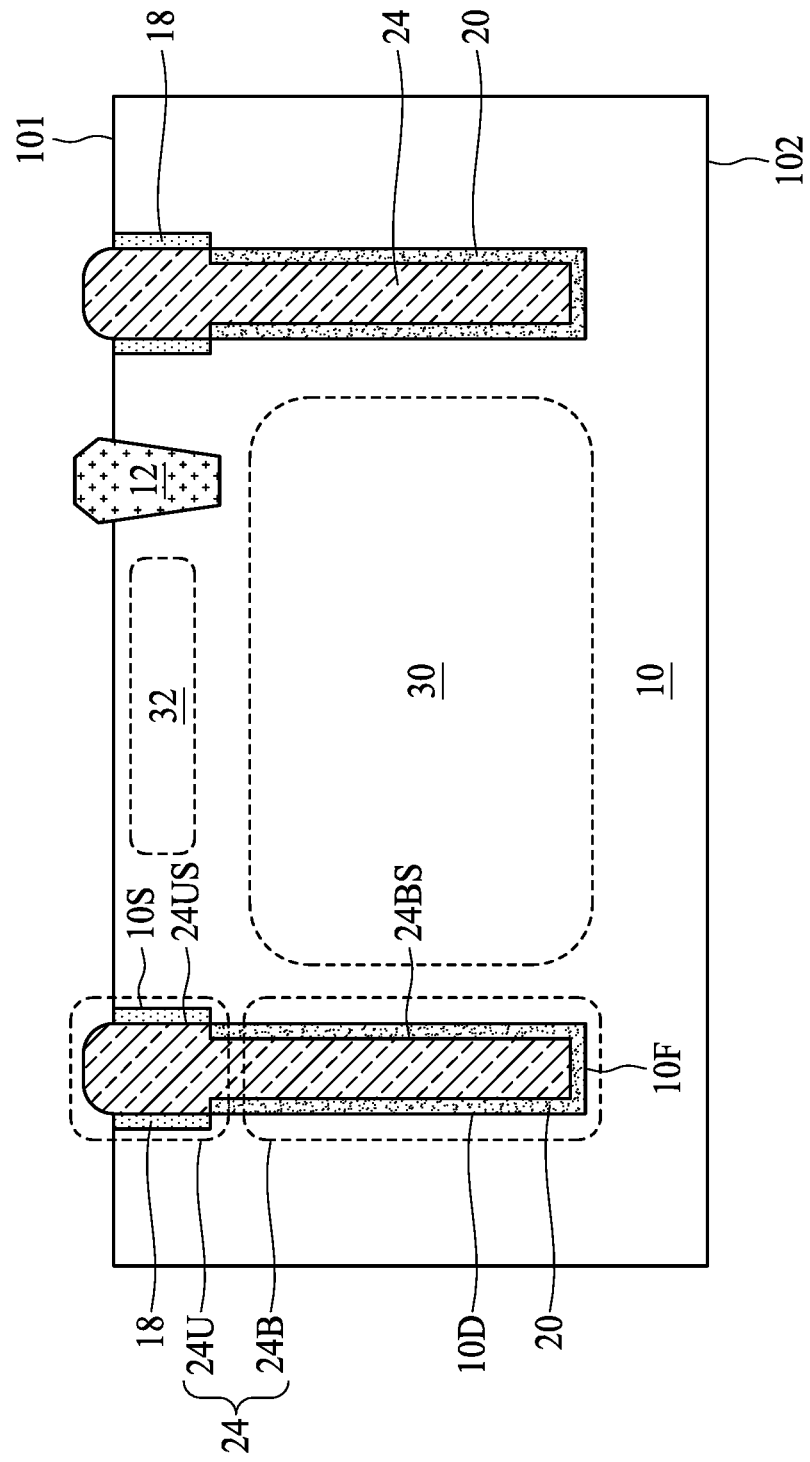
Figure 2K:
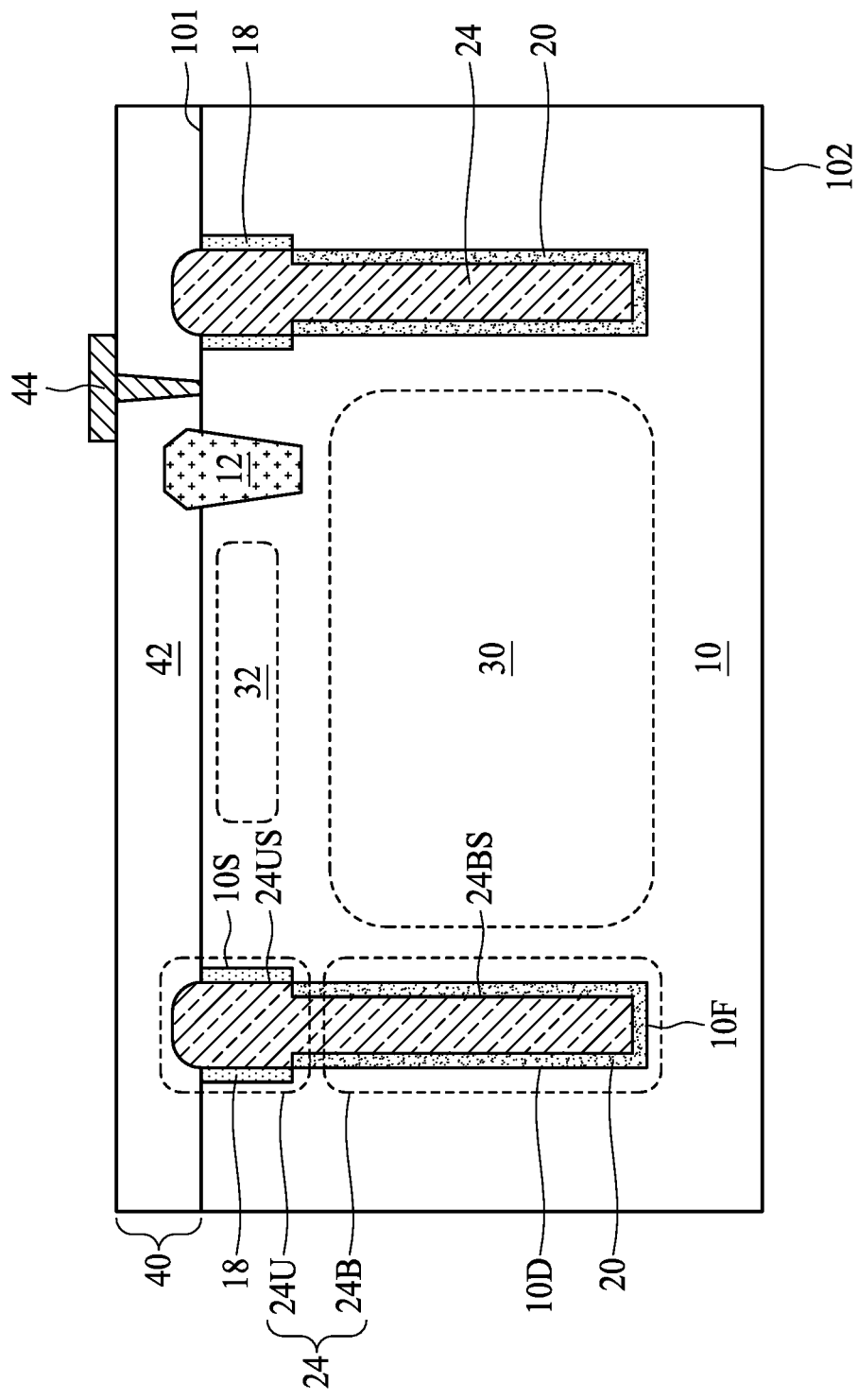
Figure 2L:
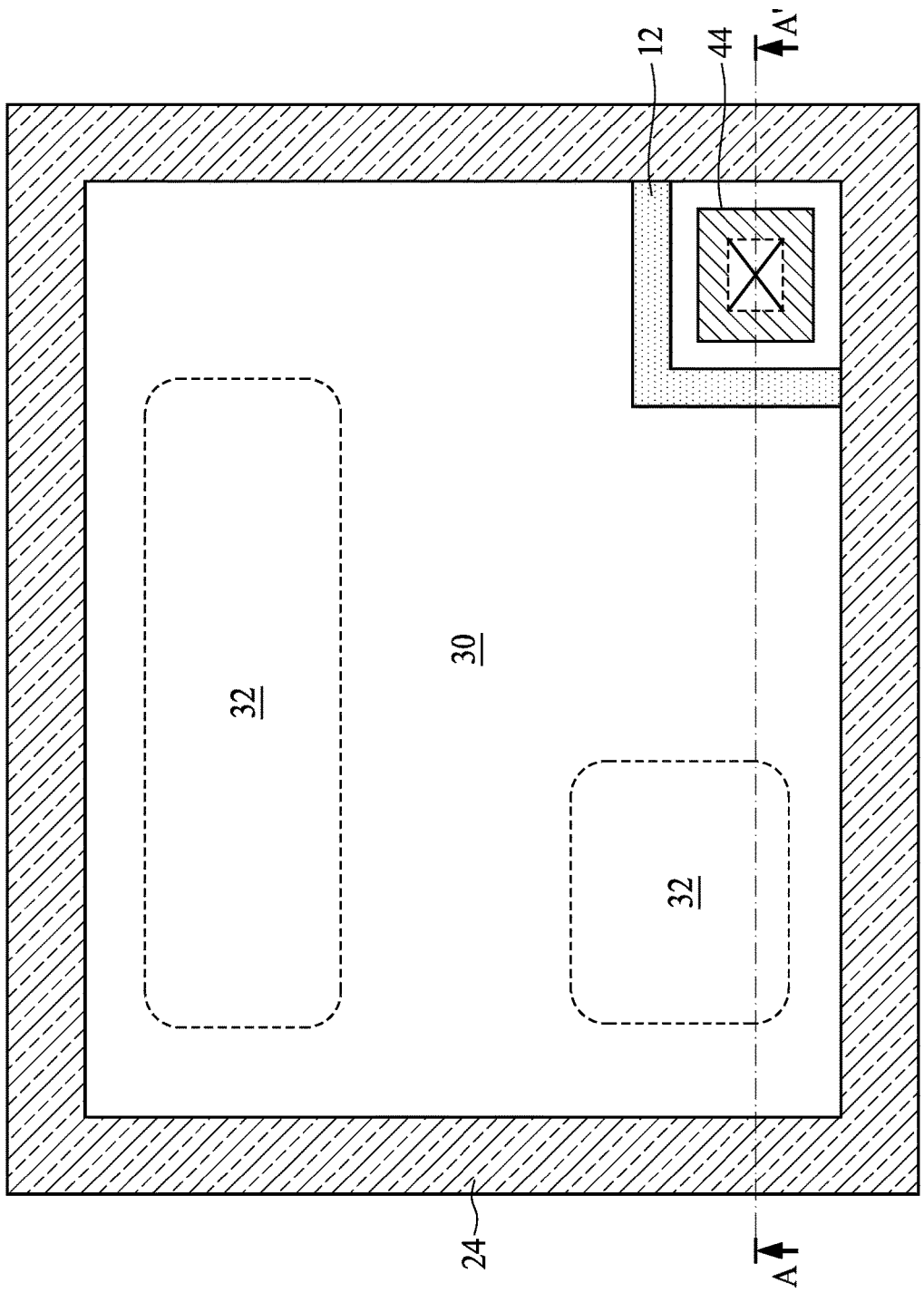

FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L and FIG. 2M are schematic views at one of various operations of manufacturing a semiconductor image sensor device according to one or more embodiments of the present disclosure, wherein FIG. 2A, FIG. 2B, FIG. 2C, FIG. 2D, FIG. 2E, FIG. 2F, FIG. 2G, FIG. 2H, FIG. 2I, FIG. 2J, FIG. 2K and FIG. 2M are cross-sectional views, and FIG. 2L is a top view, and FIG. 2K is a cross-sectional view along a ling AA' of FIG. 2L. Referring to FIG. 2A, a semiconductor substrate 10 is received. In some embodiments, the semiconductor substrate 10 may include a bulk substrate. In some embodiments, the material of the semiconductor substrate 10 may comprise elementary semiconductor such as silicon or germanium. In some embodiments, the material of the semiconductor substrate 10 may include a compound semiconductor such as silicon germanium, silicon carbide, gallium arsenic, gallium phosphide, indium phosphide or indium arsenide; or combinations thereof. In some embodiments, the semiconductor substrate 10 may also include an epitaxial semiconductor layer. In some embodiments, the semiconductor substrate 10 may include a composite substrate such as a silicon-on-insulator (SOI) substrate.

In some embodiments, the semiconductor substrate 10 has a first doping polarity. In some embodiments, the first doping polarity is P type, and the semiconductor substrate 10 may be doped with P type dopants such as boron or the like. In some embodiments, the first doping polarity is N type, and the semiconductor substrate 10 may be doped with N type dopants such as phosphorous, arsenic or the like. In some embodiments, the semiconductor substrate 10 may include a well (not shown) having the first doping polarity. The well may be configured for formation of driving components, for example.

The semiconductor substrate 10 includes a first surface 101, and a second surface 102 opposite to the first surface 101. In some embodiments, the first surface 101 may be defined as a front side of the semiconductor substrate 10, and the second surface 102 may be defined as a back side of the semiconductor substrate 10.

In some embodiments, a shallow trench 10A is formed from the first surface 101 of the semiconductor substrate 10. In some embodiments, a shallow trench isolation (STI) (also referred to as a second isolation structure) 12 may be formed from the first surface 101 of the semiconductor substrate 10 and in the shallow trench 10A. In some embodiments, the STI 12 may be formed by the following operations. The semiconductor substrate 10 is partially removed from the first surface 101 to form the shallow trench 10A in the semiconductor substrate 10. By way of example, the shallow trench (also referred to as a second trench) 10A may be formed by photolithography and etching techniques. A dielectric layer such as a silicon oxide layer is then formed over the first surface 101 of the semiconductor substrate 10 and in the shallow trench 10A. The dielectric layer may be polished such as by chemical mechanical polishing (CMP) to planarize the dielectric layer to form the STI 12. For the sake of simplicity, the detailed fabrication operations of the STI 12 are not illustrated herein.

Referring to FIG. 2B, a recess 10R is formed from the first surface 101 of the semiconductor substrate 10. In some embodiments, the recess 10R is formed by photolithography and etching techniques. By way of example, a hard mask 14 is formed over the first surface 101 of the semiconductor substrate 10. The hard mask 14 may be patterned, such that a portion of the first surface 101 of the semiconductor substrate 10 is exposed. In some embodiments, the hard mask 14 may be a multi-layered hard mask. By way of example, the hard mask 14 may include a first hard mask layer 14A, a second hard mask layer 14B and a third hard mask layer 14C stacked to one another. In some embodiments, any two adjacent layers of the first hard mask layer 14A, the second hard mask layer 14B and the third hard mask layer 14C may include different materials. For example, the material of the first hard mask layer 14A and the third hard mask layer 14C may include silicon oxide, while the material of the second hard mask layer 14B may include silicon nitride. The semiconductor substrate 10 is then etched from the first surface 101 using the hard mask 14 as an etch mask to form the recess 10R. In some embodiments, the depth of the recess 10R is substantially equal to the depth of the STI 12, but not limited thereto.

Referring to FIG. 2C, a linear dielectric layer 16 is formed over the first surface 101 of the semiconductor substrate 10, as well as in the recess 10R to cover a sidewall 10S and a bottom 10B of the recess 10R. In some embodiments, the linear dielectric layer 16 is formed by deposition techniques such as chemical vapor deposition (CVD), oxidization, or the like. In some embodiments, the linear dielectric layer 16 may be single-layered, and the material of the linear dielectric layer 16 may include an oxide compound such as silicon oxide, nitride compound such as silicon nitride, oxynitride compound such as silicon oxynitride, or other dielectric material. In some embodiments, the linear dielectric layer 16 may be multi-layered, and the material of each layer of the linear dielectric layer 16 may individually include an oxide compound such as silicon oxide, nitride compound such as silicon nitride, oxynitride compound such as silicon oxynitride, or other dielectric materials. In some embodiments, the liner dielectric layer 16 is substantially conformal with respect to the sidewall 10S of the recess OR.

Referring to FIG. 2D, the linear dielectric layer 16 over the first surface 101 of the semiconductor substrate 10 and the bottom 10B of the recess 10R is removed by e.g., etching, and the linear dielectric layer 16 covering the sidewall 10S of the recess 10R is remained, forming a diffusion barrier layer 18. In some embodiments, the diffusion barrier layer 18 may be single-layered, and the material of the diffusion barrier layer 18 may include an oxide compound such as silicon oxide, nitride compound such as silicon nitride, oxynitride compound such as silicon oxynitride, or other dielectric material. In some embodiments, the diffusion barrier layer 18 may be multi-layered, and the material of each layer of the diffusion barrier layer 18 may individually include an oxide compound such as silicon oxide, nitride compound such as silicon nitride, oxynitride compound such as silicon oxynitride, or other dielectric material.

In some embodiments, the diffusion barrier layer 18 is substantially conformal with respect to the sidewall 10S of the recess 10R. For example, the profile of the diffusion barrier layer 18 substantially follows the profile of the sidewall 10S of the recess 10R. In some embodiments, the diffusion barrier layer 18 is configured to resist the dopants of a doped layer to be formed. In some embodiments, the thickness of the diffusion barrier layer 18 is configured to be sufficient to resist the dopants of the doped layer from diffusing to the proximity of the first surface 101 where driving components are located. By way of example, the thickness of the diffusion barrier layer 18 is substantially in a range from about 10 nm to about 50 nm, but not limited thereto. In some embodiments, the depth of the diffusion barrier layer 18, which may be substantially equal to the depth of the recess 10R, may be configured based on a depth of a radiation-sensing region or a depth of the well of the semiconductor substrate 10. By way of example, the depth of the diffusion barrier layer 18, is substantially in a range from about 150 nm to about 300 nm, but not limited thereto.

Referring to FIG. 2E, a portion of the semiconductor substrate 10 is removed through the recess 10R to form a deep trench (also referred to as a first trench) 10T in the semiconductor substrate 10. In some embodiments, the deep trench 10T is formed by etching technique, and using the same hard mask 14 for defining the recess 10R as an etch mask. Accordingly, the deep trench 10T is formed in a self-aligned manner, and an additional photolithography operation can be omitted. In some embodiments, the width of the deep trench 10T is substantially equal to the width of the recess 10R, but not limited thereto. In some embodiments, the recess 10R may be defined as an upper portion of the deep trench 10T, and the rest of the deep trench 10T may be defined as a bottom portion of the deep trench 10T. The diffusion barrier layer 18 may surround a perimeter of the upper portion of the deep trench 10T.

Referring to FIG. 2F, a doped layer 20 is formed over a sidewall 10D and a bottom 10F of the deep trench 10T. In some embodiments, the doped layer 20 has the first doping polarity as the semiconductor substrate 10. In some embodiments, the doping concentration of the doped layer 20 is higher than the doping concentration of the semiconductor substrate 10. In some embodiments, the doped layer 20 is substantially conformal with respect to the sidewall 10D of the deep trench 10T. For example, the profile of the doped layer 20 substantially follows the profile of the sidewall 10D of the deep trench 10T. The doped layer 20 may surround a perimeter of the bottom portion of the deep trench 10T. In some embodiments, the doped layer 20 may be configured to repair defects due to formation of the deep trench 10T. In some embodiments, the doped layer 20 may be configured to reduce dark current and cross-talk between adjacent semiconductor image sensor devices.

The doped layer 20 may be formed by various doping techniques. In some embodiments, the doped layer 20 may be formed by forming a doped epitaxial semiconductor layer over the sidewall 10D and the bottom 10F of the deep trench 10T. By way of example, the doped epitaxial semiconductor layer may include an epitaxial semiconductor layer with P type dopants such as boron dopants or N type dopants such as phosphorous or arsenic, depending on the doping type of the semiconductor substrate 10. In some embodiments, the doped layer 20 may be formed in the sidewall 10D and the bottom 10F of the deep trench 10T by plasma doping technique. The doped layer 20 may be P type doped or N type doped, depending on the doping type of the semiconductor substrate 10. In some embodiments, the plasma doping operation may be performed at a tilt angle such that the doped layer 20 may be formed in the sidewall 10D of the deep trench 10T. In some embodiments, the doped layer 20 may be formed by forming a doped liner dielectric layer. By way of example, the doped liner dielectric layer may include a P type doped liner silicon oxide layer such as boron-doped liner silicon oxide layer or an N type doped liner silicon oxide layer such as phosphorous-doped or arsenic-doped liner silicon oxide layer formed by atomic layer deposition (ALD) or the like.

A deep trench isolation (DTI) (also referred to as a first isolation structure) is formed in the deep trench 10T. In some embodiments, the DTI may be formed by the following operations. Referring to FIG. 2G, a dielectric layer 22 is formed over the first surface 101 of the semiconductor substrate 10 and in the deep trench 10T after the diffusion barrier layer 18 and the doped layer 20 are formed over the sidewall 10D of the deep trench 10T. The dielectric layer 22 may include a silicon oxide layer, or other dielectric material. In some embodiments, the dielectric layer 22 is formed by deposition techniques such as chemical vapor deposition (CVD), or the like. Referring to FIG. 2H, the dielectric layer 22 may be polished such as by chemical mechanical polishing (CMP) to planarize the dielectric layer 22 to form a DTI 24 adjacent to the radiation-sensing region 30. In some embodiments, the DTI 24 surrounds a periphery of the radiation-sensing region 30. In some embodiments, one or more layers of the hard mask 14 may be removed subsequent to planarization of the dielectric layer 22. In some embodiments, the first hard mask layer 14A may be removed after the planarization of the dielectric layer 22. By way of example, the first hard mask layer 14A may be removed by etching or the like.

Referring to FIG. 2I, the remaining layer(s) of the hard mask 14 such as the second hard mask layer 14B and the third hard mask layer 14C are removed from the first surface 101 of the semiconductor substrate 10. By way of example, the second hard mask layer 14B and the third hard mask layer 14C may be removed by etching or the like.

At this point of the fabrication, the DTI 24 surrounded by the doped layer 20 and the diffusion barrier layer 18 is formed. The depth of the DTI 24 is greater than the depth of the STI 12. In some embodiments, the DTI 24 may be formed subsequent to formation of the STI 12. In some embodiments, the STI 12 may be formed subsequent to formation of the DTI 24. In some embodiments, the DTI 24 may also be referred to as a first isolation structure. The DTI 24 may include a first isolation portion such as a bottom isolation portion 24B, and a second isolation portion such as an upper isolation portion 24U. The bottom isolation portion 24B and the upper isolation portion 24U may be connected to each other. For example, the upper isolation portion 24U may be disposed over the bottom isolation portion 24B. In some embodiments, the width of the upper isolation structure 24U is substantially equal to the width of the bottom isolation structure 24B. The doped layer 20 may surround a sidewall 24BS of the bottom isolation portion 24B. The doped layer 20 may only surround the sidewall 24BS of the bottom isolation portion 24B without covering a sidewall 24US of the upper isolation portion 24U. The doped layer 20 may be configured to repair damages due to formation of the deep trench 10T, and/or isolate adjacent semiconductor image sensor devices so as to reduce dark current and cross-talk between adjacent semiconductor image sensor devices. The diffusion barrier layer 18 may surround the sidewall 24US of the upper isolation portion 24U. The diffusion barrier layer 18 may only surround the sidewall 24US of the upper isolation portion 24U without covering the sidewall 24BS of the bottom isolation portion 24B. The diffusion barrier layer 18 may be configured to mitigate diffusion of the dopants from the doped layer 20.

Referring to FIG. 2J, a radiation-sensing region 30 is formed in the semiconductor substrate 10. In some embodiments, the radiation-sensing region 30 includes a doped region having the second doping polarity opposite to the first polarity of the semiconductor substrate 10, and an interface between the radiation-sensing region 30 and the semiconductor substrate 10 form a PN junction. In some embodiments, the second doping polarity is N type, and the radiation-sensing region 30 may be doped with N type dopants such as phosphorous, arsenic or the like. In some embodiments, the second doping polarity is P type, and the radiation-sensing region 30 may be doped with P type dopants such as boron or the like. In some embodiments, the radiation-sensing region 30 may be formed by one or more implantations. In some embodiments, the radiation-sensing region 30 includes a photodiode. The radiation-sensing region 30 may be operable to sense or detect radiation waves entering the radiation-sensing region 30.

In some embodiments, driving components 32 may be formed in or over the semiconductor substrate 10. By way of example, the driving components 32 may include photogates, reset transistors, source follower transistors or other driving components. In some embodiments, the diffusion barrier layer 18 surrounds the driving components 32, and helps to block dopants from diffusing to the driving components 32.

Referring to FIG. 2K and FIG. 2L, an interconnection structure 40 may be formed over the first surface 101 of the semiconductor substrate 10. In some embodiments, the interconnection structure 40 may include one or more dielectric layers 42 such as interlayer dielectric, and one or more conductive structures 44. The conductive structures 44 may include conductive wirings, conductive vias, conductive pads or the like. It is understood that the dielectric layers 42 and the conductive structures 44 illustrated in FIG. 2K are an example, and the actual position and configuration of the conductive structure 44 may vary depending on design and manufacturing concerns.

Figure 2M:
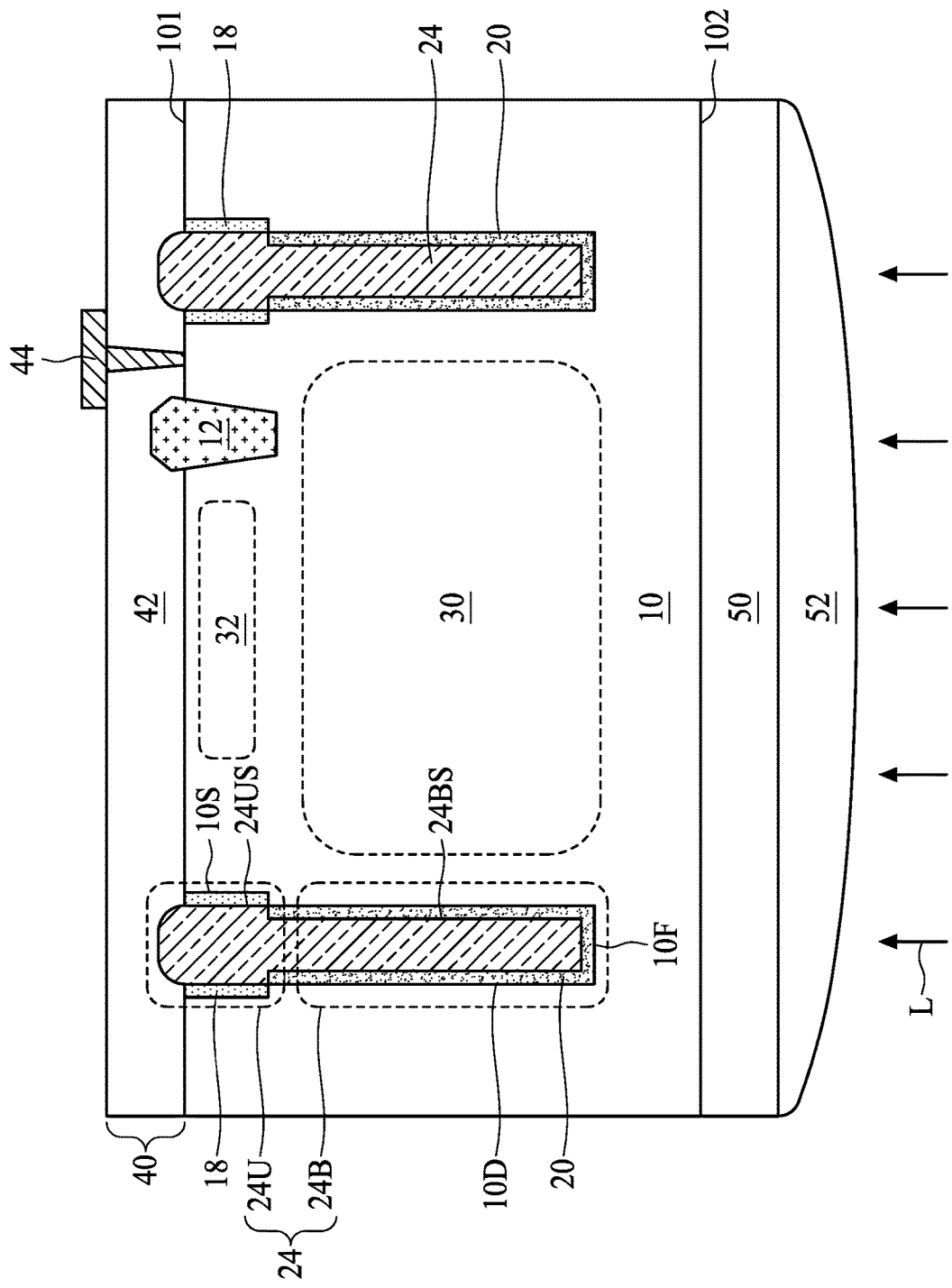

Referring to FIG. 2M, the semiconductor substrate 10 may be thinned from the second surface 102 to reduce the thickness of the semiconductor substrate 10. In some embodiments, a color filter layer 50 may be formed over the second surface 102 of the semiconductor substrate 10. The color filter layer 50 may include dye or pigment for filtering a specific wavelength band of the incoming radiation L from the back side, which corresponds to a color spectrum (e.g., red, green or blue). In some embodiments, a micro-lens 52 may be formed over the color filter layer 50. The micro-lens 52 may be configured to direct and focus the incoming radiation L from the back side toward the radiation-sensing region 30. In some embodiments, an anti-reflection coating (ARC) (not shown) may be optionally formed over the second surface 102 of the semiconductor substrate 10 to alleviate reflection of the incoming radiation L from the back side.

At this point of the fabrication, a semiconductor image sensor device 1 is formed. In some embodiments, the semiconductor image sensor device 1 may include a charge-coupled device (CCD), a complementary metal oxide semiconductor (CMOS) image sensor (CIS), or other types of semiconductor image sensor devices. It is understood that a back side illuminated (BSI) image sensor device illustrated in FIG. 2M is an example, but the semiconductor image sensor device 1 is not limited to a BSI image sensor device. It is contemplated that the various aspects of the present disclosure may be applied to a front side illuminated (FSI) image sensor device or other types of semiconductor image sensor devices.

Dark current may be defined as the existence of current when no actual illumination is present. Cross-talk may refer to electrical interference from adjacent semiconductor image sensor devices that degrade the light-sensing reliability and accuracy. One of the causes of the dark current and cross-talk may be the defects in the sidewall of the deep trench generated in the formation of the deep trench. The defects in the sidewall of the deep trench may result in movement of free charge carriers. When the free charge carriers are detected by the radiation-sensing region, dark current may occur. When the free carriers penetrate the DTI and are detected by an adjacent radiation-sensing region, cross-talk may occur.

In some embodiments of the present disclosure, the semiconductor image sensor device includes a plurality of radiation-sensing regions, and a plurality of DTIs between adjacent radiation-sensing regions. The DTI includes a bottom isolation portion, and an upper isolation portion over the bottom isolation portion. The DTI further includes a doped layer laterally surrounding the bottom isolation portion. The doped layer may help to repair defects due to formation of the deep trench, and thus reduce dark current and cross-talk between adjacent radiation-sensing regions. The DTI further include a diffusion barrier layer laterally surrounding the upper isolation portion. The diffusion barrier layer may help to mitigate diffusion of the dopants from the doped layer to the front side of the semiconductor substrate, and thus the driving components adjacent to the upper insolation portion of the DTI can be operated normally. The diffusion barrier layer is substantially conformal with respect to the sidewall of the deep trench, and thus the profile of the upper isolation portion of the DTI is relatively small. Accordingly, more layout areas can be provided for more radiation-sensing regions. The deep trench, the diffusion barrier layer and the doped layer may be formed in a self-aligned manner, thus the alignment of the deep trench, the diffusion barrier layer and the doped layer may not be an issue to consider, and the manufacturing costs may be reduced.

In one aspect, a method for manufacturing a semiconductor image sensor is provided. A semiconductor substrate is received. A recess is formed from a surface of the semiconductor substrate. A diffusion barrier layer is formed over a sidewall of the recess. A portion of the semiconductor substrate is removed through the recess to form a deep trench in the semiconductor substrate. A deep trench isolation is formed in the deep trench.

In another aspect, a method for manufacturing a semiconductor image sensor is provided. A semiconductor substrate is received. A shallow trench isolation is formed in the semiconductor substrate. A recess is formed from a surface of the semiconductor substrate. A diffusion barrier layer is formed over a sidewall of the recess. A portion of the semiconductor substrate is removed through the recess to form a deep trench in the semiconductor substrate. A deep trench isolation is formed in the deep trench. A dielectric layer is formed over the semiconductor substrate, and a conductive feature is formed in the dielectric layer. In some embodiments, the conductive structure is disposed between the deep trench isolation and the shallow trench isolation. In some embodiments, the conductive structure is surrounded by the deep trench isolation and the shallow trench isolation from a top view. In some embodiments, the conductive structure is separated from the deep trench isolation and the shallow trench isolation.

In yet another aspect, a method for manufacturing a semiconductor image sensor is provided. A semiconductor substrate is received. The semiconductor substrate has a first surface and a second surface opposite to the first surface. A shallow trench isolation is formed in the semiconductor substrate from the first surface. A recess extended from the first surface of the semiconductor substrate is formed. A diffusion barrier layer is formed over a sidewall of the recess. A portion of the semiconductor substrate is removed through the recess to form a trench extended from a bottom of the recess in the semiconductor substrate. A doped layer is formed over a sidewall of the trench. A first isolation structure is formed in the recess and a second isolation structure is formed in the trench. An interconnection structure is formed over the first surface of the semiconductor substrate. In some embodiments, the first isolation structure is extended from the first surface of the semiconductor substrate into a dielectric of the interconnection structure. In some embodiments, a top surface of the first isolation structure is in contact with the dielectric layer of the interconnection structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor image sensor, comprising:
    receiving a semiconductor substrate having a first surface and a second surface opposite to the first surface;
    forming a recess from the first surface of the semiconductor substrate;
    forming a diffusion barrier layer over a sidewall of the recess;
    removing a portion of the semiconductor substrate through the recess to form a deep trench in the semiconductor substrate;
    forming a doped layer over a sidewall and a bottom of the deep trench;
    forming a deep trench isolation in the deep trench, wherein a top surface of the doped layer is in contact with the deep trench isolation;
    forming a dielectric layer over the first surface of the semiconductor substrate, wherein the deep trench isolation is extended from the first surface of the semiconductor substrate into the dielectric layer; and
    forming a color filter layer over the second surface of the semiconductor substrate.

2. The method of claim 1, wherein the forming of the doped layer is prior to the forming of the deep trench isolation.

3. The method of claim 1, wherein the forming of the diffusion barrier layer over the sidewall of the recess comprises:
    forming a liner dielectric layer over the first surface of the semiconductor substrate, a bottom and the sidewall of the recess; and
    removing the liner dielectric layer from the first surface of the semiconductor substrate and the bottom of the recess.

4. The method of claim 1, further comprising:
    forming a shallow trench from the first surface of the semiconductor substrate; and
    forming a shallow trench isolation in the shallow trench, wherein a depth of the deep trench isolation is greater than a depth of the shallow trench isolation.

5. The method of claim 4, wherein a depth of the recess is less than the depth of the shallow trench isolation.

6. The method of claim 1, wherein the diffusion barrier layer is substantially conformal with respect to the sidewall of the recess.

7. The method of claim 1, further comprising forming an interconnection structure over the semiconductor substrate, wherein the interconnection structure comprises the dielectric layer and at least a conductive feature.

8. The method of claim 7, wherein the deep trench isolation comprises an upper portion and a bottom portion, the upper portion is extended from the semiconductor substrate into the dielectric layer of the interconnection structure, and a top surface of the upper portion of the deep trench isolation is in contact with the dielectric layer of the interconnection structure.

9. A method for manufacturing a semiconductor image sensor, comprising:
    receiving a semiconductor substrate having a first surface and a second surface opposite to the first surface;
    forming a shallow trench isolation in the semiconductor substrate;
    forming a recess from the first surface of the semiconductor substrate;
    forming a diffusion barrier layer over a sidewall of the recess;
    removing a portion of the semiconductor substrate through the recess to form a deep trench in the semiconductor substrate;
    forming a doped layer over a sidewall and a bottom of the deep trench; and
    forming a deep trench isolation in the deep trench, wherein a top surface of the doped layer is in contact with the deep trench isolation;

forming a dielectric layer over the first surface of the semiconductor substrate and a conductive structure in the dielectric layer, wherein the deep trench isolation is extended from the first surface of the semiconductor substrate into the dielectric layer; and forming a color filter layer over the second surface of the semiconductor substrate, wherein the conductive structure is disposed between the deep trench isolation and the shallow trench isolation, surrounded by the deep trench isolation and the shallow trench isolation from a top view, and separated from the deep trench isolation and the shallow trench isolation.

10. The method of claim 9, wherein the forming of the doped layer is prior to the forming of the deep trench isolation.

11. The method of claim 9, wherein the forming of the diffusion barrier layer over the sidewall of the recess comprises:

forming a liner dielectric layer over the first surface of the semiconductor substrate, a bottom and the sidewall of the recess; and removing the liner dielectric layer from the first surface of the semiconductor substrate and the bottom of the recess.

12. The method of claim 9, wherein the deep trench isolation comprises an upper portion and a bottom portion, and the diffusion barrier layer surrounds a sidewall of the upper portion.

13. The method of claim 12, wherein a depth of the upper portion is less than a depth of shallow trench isolation.

14. The method of claim 12, wherein a top surface of the upper portion of the deep trench isolation is in contact with the dielectric layer.

15. The method of claim 9, further comprising forming at least a driving component and a radiation-sensing region in the semiconductor substrate prior to the forming of the dielectric layer and the conductive feature.

16. A method for manufacturing a semiconductor image sensor, comprising:

receiving a semiconductor substrate having a first surface and a second surface opposite to the first surface;

forming a shallow trench isolation in the semiconductor substrate extended from the first surface;

forming a recess extended from the first surface of the semiconductor substrate;

forming a diffusion barrier layer over a sidewall of the recess;

removing a portion of the semiconductor substrate through the recess to form a trench extended from a bottom of the recess in the semiconductor substrate;

forming a doped layer over a sidewall of the trench;

forming a first isolation structure in the recess and a second isolation structure in the trench;

forming an interconnection structure over the first surface of the semiconductor substrate; and forming a color filter layer over the second surface of the semiconductor substrate after the forming of the interconnection structure, wherein the first isolation structure is extended from the first surface of the semiconductor substrate into a dielectric layer of the interconnection structure, and a top surface of the first isolation structure is in contact with the dielectric layer of the interconnection structure.

17. The method of claim 16, wherein the forming the diffusion barrier layer over the sidewall of the recess comprises:

forming a liner dielectric layer over the first surface of the semiconductor substrate, the bottom and the sidewall of the recess; and removing the liner dielectric layer from the first surface of the semiconductor substrate and the bottom of the recess.

18. The method of claim 16, wherein a depth of the first isolation structure is less than a depth of shallow trench isolation.

19. The method of claim 16, further comprising forming at least a driving component and a radiation-sensing region in the semiconductor substrate prior to the forming of the interconnection structure.

20. The method of claim 16, further comprising forming a micro-lens over the second surface of the semiconductor substrate after the forming of the color filter layer.

* * * * *